United States Patent [19]

Murayama

[11] 4,204,135
[45] May 20, 1980

[54] PIEZOELECTRIC ELEMENTS OF ORGANIC HIGH MOLECULAR WEIGHT MATERIALS

[75] Inventor: Naohiro Murayama, Iwaki, Japan

[73] Assignee: Kureha Kagaku Kogyo Kabushiki Kaisha, Tokyo, Japan

[21] Appl. No.: 688,818

[22] Filed: May 21, 1976

Related U.S. Application Data

[63] Continuation of Ser. No. 587,782, Jun. 17, 1975, abandoned, which is a continuation of Ser. No. 424,029, Dec. 12, 1973, abandoned, which is a continuation-in-part of Ser. No. 204,263, Dec. 2, 1971, abandoned.

[30] Foreign Application Priority Data

Dec. 2, 1970 [JP] Japan ................................. 45/106022

[51] Int. Cl.$^2$ ........................................... H01L 41/18
[52] U.S. Cl. .................................. 310/357; 307/400; 310/800
[58] Field of Search ................... 307/88 ET; 310/800, 310/357

[56] References Cited

U.S. PATENT DOCUMENTS

| | | | |
|---|---|---|---|
| 3,053,818 | 9/1962 | Honn et al. | 260/80.5 |
| 3,451,978 | 6/1969 | Chalmers | 260/78.5 |
| 3,691,264 | 9/1972 | Asahina | 264/22 |

*Primary Examiner*—Mark O. Budd
*Attorney, Agent, or Firm*—Sughrue, Rothwell, Mion, Zinn and Macpeak

[57] ABSTRACT

Organic piezoelectric elements having a piezoelectric modulus of the order of as high as $10^{-6}$ c.g.s.e.s.u. or more are obtained from a film, sheet or other shaped structure of a high molecular weight copolymer of 99 to 50% by weight of vinylidene fluoride with, correspondingly, 1 to 50% by weight of a comonomer, by heating the shaped structure to a temperature of 40° to 200° C. in an electrostatic field of an electropotential gradient of 30 to 1,500 KV/cm.

15 Claims, 2 Drawing Figures

PIEZOELECTRIC ELEMENTS OF ORGANIC HIGH MOLECULAR WEIGHT MATERIALS

CROSS-REFERENCE TO RELATED APPLICATIONS

This application is a continuation of Ser. No. 587,782, filed June 17, 1975 which is in turn continuation of Ser. No. 424,029, filed Dec. 12, 1973 which is in turn a continuation-in-part application of Ser. No. 204,263, filed Dec. 2, 1971 all now abandoned.

BACKGROUND OF THE INVENTION

This invention relates to a process for the manufacture of shaped structures having a high piezoelectric property out of a copolymer of vinylidene fluoride.

Heretofore, quartz, Rochelle salt, barium titanate ceramics and other inorganic piezoelectric materials have been known, and recently it has been ascertained that certain biological materials and synthetic high molecular weight compounds also possess a piezoelectric property. The biological tissue which has been ascertained to possess a piezoelectric property includes, e.g., bone, skin, blood vessel, trachea, muscle, hair, ivory, silk, bamboo and wood, and it is now believed that most proteins possess a piezoelectric property. A piezoelectric property is observable also on monoaxially stretched films of poly($\alpha$-benzyl glutamate), poly($\gamma$-methyl glutamate) and like synthetic polymers of single amino acids. Other than these instances, it has long been known that when a high molecular weight polymer film is subjected to the action of an electrostatic field of a high potential gradient at a relatively high temperature and then cooled in the electrostatic field to room temperature as to set it in a state where it is dielectrically polarized in the direction perpendicular to its both surfaces, there is formed a so-called electret. Although it was known that the electret possesses a piezoelectric property, it was extremely small.

Recently, with the development of high polymer electrets, determinations of piezoelectric properties of various electrets have been made, and it has been found that films of polyvinylidene fluoride (hereinafter polyvinylidene fluoride will be referred to as PVDF), polyvinyl fluoride, polyvinyl chloride and like polar high molecules possess, in particular, an ever-lasting piezoelectric property. Especially with PVDF, a high piezoelectric property has been observed and, for instance, a piezoelectric PVDF film having a piezoelectric modulus d31, taking the direction of monoaxial stretching of the film as the X-axis, of the order of $10^{-7}$ c.g.s.e.s.u., has been obtained by monoaxially stretching a PVDF film by a few times its original dimension at 120° to 150° C. and polarizing the stretched film in an electrostatic field of a potential gradient of about 300 KV/cm at 80° to 90° C.

High polymer polarized films having high piezoelectric moduli all were formed hitherto, on the basis of a monoaxially stretched film, and none was made from an unoriented film or molding. With respect to piezoelectric films formed of PVDF, a high piezoelectric modulus was found on a stretched and molecular oriented film.

Piezoelectric high molecular weight films in most cases exhibit a tensile piezoelectric property and, in this case, the piezoelectric property is indicated by a piezoelectric modulus d attributable to a dielectric polarization in a direction perpendicular to the surface of the film under a tensile stress.

With respect to piezoelectric high polymer films, taking the direction of monoaxial stretching as the X-axis, the direction perpendicular to the X-axis and parallel to the direction of the surface of the film as the Y-axis, and the direction perpendicular to the surface of the film as the Z-axis, to determine X-, Y- and Z-axes, and taking the piezoelectric modulus indicating a polarization in the direction of the Z-axis under a tensile stress in the direction of the X-axis as $d_{31}$, and that under a tensile stress in the direction of the Y-axis as $d_{32}$, the $d_{31}$ and $d_{32}$ in most cases differ from each other and, in case of a monoaxially stretched film of PVDF, the value of $d_{31}$ reached about 10 times that of $d_{32}$ or more. And, with respect to a monoaxially stretched film of poly($\gamma$-methyl glutamate), it is known that the piezoelectric modulus in the direction of the Z-axis takes a maximum value when the film is tensioned in the direction meeting both the X- and Y-axes at angles of 45°. Thus, most of such stretched high polymer films are anisotropic in piezoelectric property. Expecially in the case of monoaxially stretched PVDF films, it is possible to obtain a polarized film having a piezoelectric modulus $d_{31}$ of $10^{-6}$ c.g.s.e.s.u. or more at maximum and such an electret is of great value, but they have drawbacks, e.g., when used as a diaphragm in a loud speaker, the polarized film vibrates with extremely different amplitudes in the direction of its X-axis and of its Y-axis, namely, it cannot vibrate with uniformity, by virtue of the high anisotropy as mentioned above, and, so long as it is a monoaxially stretched film, there is a limit to its thickness and form.

On the other hand, unoriented PVDF films and PVDF moldings have no anisotropy with respect to piezoelectric property and thick sheets and pipes, spheres and other optional shapes are obtainable, but it is difficult to form a polarized film therefrom having a piezoelectric modulus exceeding $10^{-8}$ c.g.e.s.u.

SUMMARY OF THE INVENTION

We have now discovered that unoriented vinylidene fluoride copolymer articles possess an unexpectedly high piezoelectric property compared with unoriented PVDF (vinylidene fluoride homopolymer) articles. Thus, in accordance with the present invention, it is possible to form a film having a very high piezoelectric property and being free from anisotropy in piezoelectric property and, in addition, to impart a high piezoelectric property to a very thin film, thick sheet, pipe, spherical or otherwise-shaped structure of a complicated configuration or coating or film, and thus, it has been made possible to use piezoelectric shaped articles in hitherto unknown (new) fields of industrial application.

In view of the established theory and common knowledge in the art that the piezoelectric property of a substance is attributable to a strain in the crystals due to a compressive force, and comparing a homopolymer with a copolymer consisting predominantly of the same integral units with the homopolymer, the former has a higher crystallinity than the latter, it would be a fact worthy of special mention that in an unoriented state a vinylidene fluoride copolymer could take a high piezoelectric modulus compared with PVDF.

We have found that it is possible to form a piezoelectric film having a piezoelectric modulus of as high as $10^{-6}$ c.g.s.e.s.u. or more out of a stretched PVDF homopolymer film, but the PVDF has a shortcoming in that it is difficult to otain a piezoelectric body having a predetermined piezoelectric modulus because its piezoelectric modulus varies to a great extent depending on, e.g., stretching conditions. In contrast to this, the vinylidene fluoride copolymer has advantages that the shifting of piezoelectric modulus by the influence of the stretching conditions is not so large and that a stretched film of the copolymer is more easily handled than that of PVDF. Thus, the PVDF copolymer has properties quite different from the PVDF homopolymer.

The present invention becomes possible by a simple process for the manufacture of piezoelectric high polymer shaped structures which is characterized by polarizing the shaped structure of a vinylidene fluoride copolymer at a temperature of at least 40° C. in an electrostatic field of a potential gradient of 30 to 1,500 KV/cm.

DETAILED DESCRIPTION OF THE INVENTION

Figure 1:
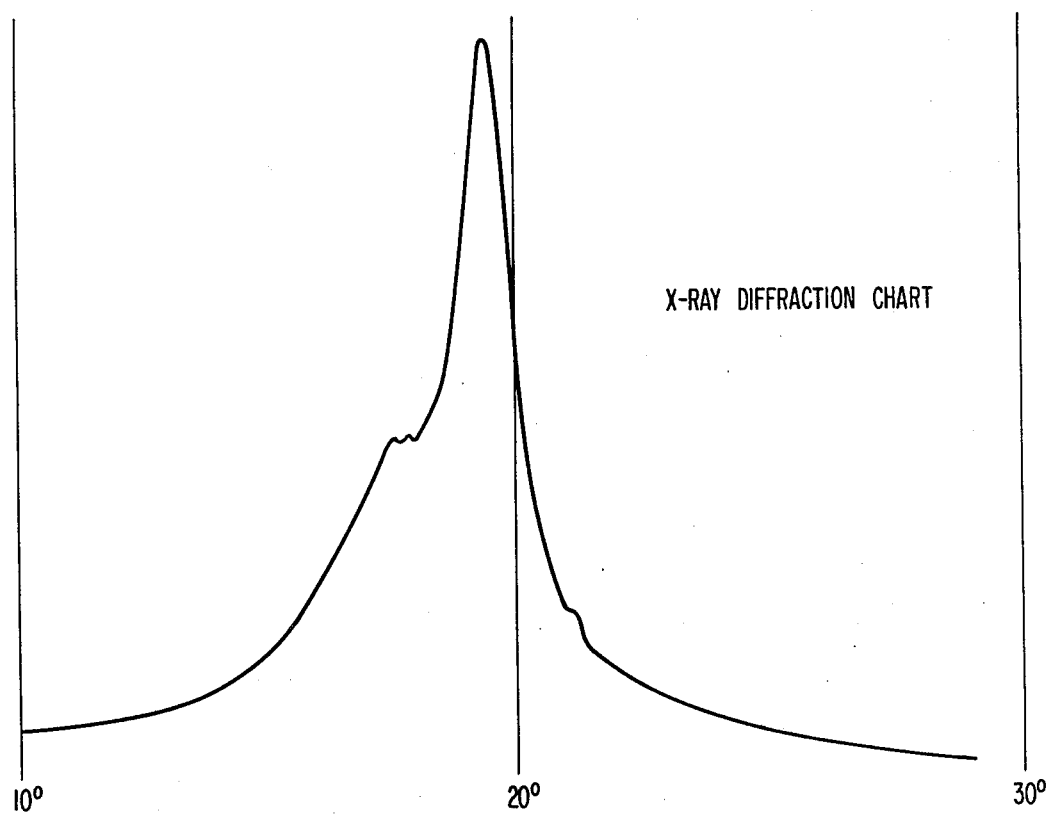
FIG. 1 is an X-ray diffraction chart relating to Example 1 of the process of the present invention.

The term "vinylidene fluoride copolymer" means copolymers of a major proportion of vinylidene fluoride monomer with a minor proportion of one or more comonomers copolymerizable therewith and hereinafter will be referred to as PVDF copolymer. From the view-point of copolymerizability, the comonomers preferred are tetrafluoroethylene, trifluoroethylene, trifluoromonochloroethylene, vinyl fluoride, hexafluoropropylene and the like, although many other copolymerizable mohomers may be used.

The shaped structure of PVDF copolymer is not restricted to a film and includes films, sheets, blocks, rods and other shaped structures of various configurations.

The film, sheet and like shaped structures may be those molded or otherwise formed by cooling a melt of PVDF copolymer and may be mono- or biaxially stretched ones. The piezoelectric modulus in the direction of molecular orientation in a mono- or biaxially stretched film is in general higher than that of an unoriented one, that is, in case of stretched and oriented films, a high polarizing effect under low temperature and low voltage conditions is obtainable. However, in case of PVDF copolymer, differing from the case of PVDF, it is possible to obtain an unoriented product having a high piezoelectric modulus comparable with that of an oriented product in the direction of orientation by an appropriate choice of polarizing conditions.

It is surprising that a piezoelectric film having such a high piezoelectric modulus can be formed of an unoriented shaped structure, as was hitherto unknown. The polarized film formed of an unoriented film has no anisotropy in piezoelectric modulus.

An unoriented piezoelectric film of PVDF copolymer manufactured under an optimum condition possesses a very high piezoelectric property of $10^{-6}$ c.g.s.e.s.u. or more, completely differing from a polarizing film of PVDF. In case of shaped structures which have been oriented by, e.g., stretching the PVDF copolymer has an advantage over the PVDF that a shaped structure of PVDF copolymer is stretchable more easily than that of PVDF under the same stretching condition and sometimes results in a polarized film having a higher piezoelectric property than that formed of the latter under the same polarizing conditions. In addition, compared with PVDF, PVDF copolymers have low melting points and can easily be processed as to pliability and solubility in a solvent to obtain a pliable piezoelectric shaped structure. It is possible to impart a high piezoelectric property to a thin film case from a solvent solution of a PVDF copolymer, and this makes it possible to manufacture very thin piezoelectric elements and piezoelectric elements of very complicated configurations or of very small dimensions, which are difficult to attain with PVDF.

In polarizing the shaped structure of PVDF copolymer thus obtained, the shaped structure is interposed between a pair of electrodes, a D.C. high voltage is imposed between the electrodes, the shaped structure is maintained at an elevated temperature for a predetermined time and then cooled. In the present invention it is an essential condition to impose a D.C. voltage, and cooling to room temperature is not necessary. For example, in case of cooling slowly in a constant temperature bath, it is desirable to cool to room temperature while contenuing the imposing of the D.C. voltage, although it does not matter that the electret is removed from the bath or the the electrode are removed immediately after imposing the D.C. voltage. In this point, the piezoelectric element of the present invention is different from an electret having a surface charge and shows a stable piezoelectricity even at the temperature used for polarization. The electrode may be in contact with a surface of the shaped structure as in the case of an electrode formed on the surface of the shaped structure by e.g., a vacuum metallizing process, or may be faced to a surface of the shaped structure leaving a narrow space therebetween. The voltage imposed between the electrodes preferably is as high as possible, so long as it forms an electrostatic field of a potential gradient of at least 30 KV/cm and not exceeding the withstand voltage of the film, although from the practical point of view, a voltage is preferred that results in a potential gradient of 100 KV/cm to 1,500 KV/cm. During the polarization, the shaped structure should be maintained at an elevated temperature for a time enough to bring the whole of the shaped structure to a temperature to allow dielectric polarization. In general, from a practical point of view, a polarizing time of 2 hours or less is selected, but a longer time is preferably for a sufficient polarization. The polarization temperature may range from 40° C. to 200° C. Although the temperature can be above the melting point of the PVDF copolymer in question, which range from 130° C. to 180° C., the temperatures below it are preferred, because the breakdown voltage of the copolymers suddenly falls if the temperature exceeds the melting points of the PVDF copolymers.

The higher the temperature, the better, so long as it is below the melting point of the copolymer. Hence, the most preferred temperatures are those between 100° C. and the melting points of PVDF copolymers.

The shaped structures thus polarized exhibits an excellent piezoelectric property which has at room temperature a very long life. It has been found that, while piezoelectric high molecule shaped structures are obtained by polarization, the piezoelectric shaped article of PVDF copolymer in accordance with the present invention retains its piezoelectric property, differing from the ordinary electrets, even after it has lost its characteristics as an electret, e.g., surface charges because of decay of the superficial electric charge. For instance, the piezoelectric film of the present invention loses its surface electric charge when steeped in water but retains its piezoelectric property substantially unchanged, as indicated in the examples. This indicates that the piezoelectric property of the piezoelectric shaped structure of the present invention is not a property of electric in general but is a characteristic of PVDF copolymer. The determination of piezoelectric modulus was performed in the same method using a silver emulsion transfar tape electrode as disclosed in French Patent No. 7,134,536. What can be determined with accuracy is $d_{31}$ or $d_{32}$ or d, although it is not unexpected to obtain a product having a high value of $d_{33}$ other than $d_{31}$ or $d_{32}$. The piezoelectric element of the present invention is used generally by providing electrodes having a conductivity such as a metal, carbon, conductive glass, conductive high polymer and etc., to both surfaces of the element. Some gap between the electrodes and the piezoekectric moldings may be allowed although being desirable to stick together tightly. The electrodes may be attached to, or pressed to, or vapor-evaporated on the moldings. Gold, aluminum, tin, zinc, nickel, chrome, platinum and their mixtures are desirable as a metal used in the evaporation, and conductive metallic oxides may be also be used. Further, transparent electrodes such as a "nesa" glass may be used.

The pizoelectric shaped structure thus obtained is expected to be used for electro-sound conversion and electromechanical conversion, as a pressure sensitive element, in a variety of industrial fields of application of piezoelectric bodies.

The unoriented piezoelectric shaped article of the present invention has an advantage that it may be of any configuration other than film and sheet and that one in the form of film is applicable to an electro-sound convertor without any difficulty in design by virtue of its isotropy in piezoelectric property. And, its high workability makes it possible to form or build up pressure sensitive elements of a complicated configuration and very small or thin piezoelectric elements. As piezoelectric elements in the present invention have large pyroelectricity in its internal polarization it is adaptable as a pyro-electric element.

The present invention will now be illustrated in more detail by the following examples which are given by way of illustration and not by way of limitation:

EXAMPLE 1

A polymerization mixture of the following formulation was charged into a 5 liters stainless steel autoclave.

| Recipe: | |
| --- | --- |
| Vinylidene Fluoride | 1,000 g |
| Tetrafluoroethylene | 280 g |
| Water | 3,500 g |
| Methocel | 3.5 g |
| n-Propyl Peroxicarbonate | 12 g |

After being purged of air with gaseous nitrogen, the charge was maintained at 25° C. for 25 hours with stirring at 450 r.p.m. The autoclave was then opened and the copolymer thus formed was withdrawn, thoroughly washed with water and dried at 60° C. for a day to obtain 1,250 g of a white powder. The intrinsic viscosity of the copolymer, as determined in a 4 g/l solution in dimethylformamide at 30° C., was 1.14. The melting point of the copolymer, as determined by means of a differential calorimeter at a rate of temperature increase of 4° C./min, was 140° C. The powdered copolymer was molded at 200° C. in a hot press into a film a thickness of about 0.15 mm. The X-ray diffraction chart was as shown in the FIG. 1 of the accompanying drawings. This film having already been crystallized was high in crystallinity as is understood from the X-ray diffraction chart. This copolymer represented the crystalline molding under the general molding condition and such a condition could not be achieved if it were amorphous or near amorphous. A film having high piezoelectricity was obtained from the film having high crystallinity. No molecular orientation by analysis of the X-ray diffraction chart was observed. The molded film was polarized by interposing it between a pair of stainless electrodes and maintaining it at an elevated temperature, as indicated in the following Table 1, for 30 minutes and thereafter cooling to room temperature while imposing a high D.C. voltage, as indicated in the Table 1, between the electrodes during the heating and cooling steps.

The piezoelectric moduli of the so polarized films were as summarized in the following Table 1:

Each of these piezoelectric films exhibited a homocharge surface voltage of 300 to 600 V initially, and its surface voltage was gradually attenuated and ultimately the voltage was lost within several hours. Their piezoelectric moduli remained nearly constant after this loss of charge. Moreover, after maintaining in water for an hour the Run No. 1 film of which the water on the surface had removed also loss its surface charge, but its piezoelectric modulus remained constant.

Table 1

| Run No. | Polarizing Temperature (°C.) | Field Strength (KV/cm) | Piezoelectric Modulus $d_{31}$ (c.g.s.e.s.u.) |
| --- | --- | --- | --- |
| 1 | 130 | 154 | $2.6 \times 10^{-7}$ |
| 2 | 135 | 230 | $4.2 \times 10^{-7}$ |
| 3 | 135 | 450 | $8.3 \times 10^{-7}$ |

The very high piezoelectric property as indicated above was obtained without orientation by stretching.

EXAMPLE 2

A copolymer sheet of a thickness of 0.5 mm, prepared in a similar manner as in Example 1, was stretched at room temperature by 3 times its original length and the stretched film was polarized in the same manner as in Example 1 to obtain electrets having piezoelectric moduli as summarized in the following Table 2:

Each of these piezoelectric films exhibited a homocharge surface voltage 300 to 600 V initially, and its surface voltage was gradually attenuated and ultimately lost within several hours. Their piezoelectric moduli remained nearly constant after the loss of charge.

Table 2

| Run No. | Polarizing Temperature (°C.) | Field Strength (KV/cm) | Piezoelectric Modulus $d_{31}$ (c.g.s.e.s.u.) |
| --- | --- | --- | --- |
| 1 | 135 | 150 | $4.8 \times 10^{-7}$ |
| 2 | 135 | 230 | $8.5 \times 10^{-7}$ |
| 3 | 135 | 450 | $6.2 \times 10^{-7}$ |
| 4 | 120 | 400 | $8.5 \times 10^{-7}$ |

Table 2-continued

| Run No. | Polarizing Temperature (°C.) | Field Strength (KV/cm) | Piezoelectric Modulus $d_{31}$ (c.g.s.e.s.u.) |
| --- | --- | --- | --- |
| 5 | 90 | 300 | $9.0 \times 10^{-8}$ |

EXAMPLE 3

The same copolymer as in Example 2 was molded into a 0.2 mm thick sheet and the sheet was maintained at a temperature, as listed in the following Table 3, for 30 minutes in DC electric field and then cooled to room temperature in the electric field to obtain piezoelectric films having piezoelectric moduli as summarized in the following Table 3:

Table 3

| Run No. | Polarizing Temperature (°C.) | Field Strength (KV/cm) | Piezoelectric Modulus $d_{31}$ (c.g.s.e.s.u.) |
| --- | --- | --- | --- |
| 1 | 150 | 40 | $1.0 \times 10^{-7}$ |
| 2 | 180 | 35 | $5 \times 10^{-8}$ |

EXAMPLE 4

Vinylidene fluoride and a comonomer were copolymerized in a weight ratio of 95 to 5 using a similar formulation as described in Example 1 to obtain a copolymer at a yield of 95% or more. As the comonomer, vinylfluoride, trifluoromonochloroethylene or tetrafluoroethylene was used.

The copolymer was hot pressed into a 0.2 mm thick film which was then stretched at room temperature by means of a roll by about 2.4 times its original length. The so stretched film was polarized under the conditions of 150° C., 200 KV/cm, and subjected to a determination of the piezoelectric modulus $d_{31}$ under tension in the direction of the stretching. The results were as summarized in the following Table 4:

Table 4

| Run No. | Comonomer | Piezoelectric Modulus $d_{31}$ (c.g.s.e.s.u.) |
| --- | --- | --- |
| 1 | Vinyl fluoride | $1.2 \times 10^{-7}$ |
| 2 | Trifluoromonochloroethylene | $3.6 \times 10^{-8}$ |
| 3 | Tetrafluoroethylene | $8.2 \times 10^{-7}$ |

EXAMPLE 5

In a similar manner as in Example 1, except that the weight ratio in the charge of vinylidene fluoride to tetrafluoroethylene was 95 to 5, a copolymer was obtained at a yield of 95% or more.

The copolymer and a PVDF were separately formed into 0.2 mm thick films. Each of the films was stretched at 150° C. by about 3 times its original length to obtain an about 65 microns thick film which was then polarized under the conditions of 120° C. and 300 KV/cm and subjected to a determination of the piezoelectric modulus under a tension in the direction of the stretching. The results were as summarized in the following Table 5:

Table 5

| Run No. | Specimen | Piezoelectric Modulus $d_{31}$ (c.g.s.e.s.u.) |
| --- | --- | --- |
| 1 | PVDF copolymer | $2.5 \times 10^{-7}$ |
| 2 (control) | PVDF | $7.0 \times 10^{-8}$ |

EXAMPLE 6

A copolymer of vinylidene fluoride and tetrafluoroethylene obtained in a charge ratio by weight of 50/50 at a yield of 95% or more, was hot pressed into a film of a thickness of 100 microns, which was then polarized under the conditions of 150° C. and 300 KV/cm. The piezoelectric modulus determined on the specimen was $d = 1.0 \times 10^{-7}$ c.g.s.e.s.u.

EXAMPLE 7

A copolymer of vinylidene fluoride and tetrafluoroethylene, prepared in a charge ratio by weight of 90/10 at an yield of 95% or more, was hot pressed into a film of a thickness of 100 microns. The copolymer film and a PVDF film of the same thickness as a control were polarized under the conditions of 150° C. and 300 KV/cm to obtain the following results:

| | Piezoelectric modulus d (c.g.s.e.s.u.) |
| --- | --- |
| Copolymer | $1.5 \times 10^{-7}$ |
| PVDF (Control) | $2.2 \times 10^{-8}$ |

EXAMPLE 8

A copolymer of vinylidene fluoride and trifluoromonochloroethylene, prepared in a charge ratio by weight of 70/30 and at a yield of 57%, was hot pressed into a film of a thickness of 200 microns. The film thus obtained was a rubbery pliable one and had a very low crystallinity as indicated by X-ray diffraction. The film was stretched by about 3 times and electretized under the condition of 150° C. and 100 KV/cm to obtain an electret having a piezoelectric modulus $d_{31}$ under tension in the direction of the stretching of $2.7 \times 10^{-8}$ c.g.s.e.s.u.

EXAMPLE 9

A copolymer of vinylidene fluoride and tetrafluoroethylene prepared in the similar manner as in Example 1, except for the use of a charge ratio by weight of the monomers of 70/30, was formed into a 0.15 mm thick film which was then polarized under the conditions of 130° C. and 300 KV/cm.

Figure 2:
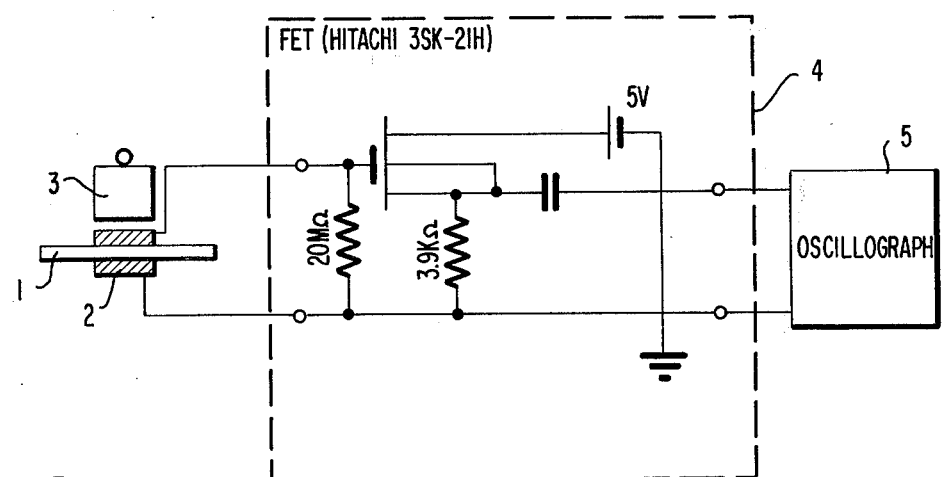
FIG. 2 is a schematic view of the apparatus utilized in Example 9 of the process of the present invention.

The piezoelectric film (1) thus obtained was interposed between a pair of 1 cm x 1 cm electrodes (2), as shown in FIG. 2 of the accompanying drawings, and the momentary largest voltage generated when a weight (3) of 1 Kg was put on the electrodes or removed therefrom was determined by means of an oscillograph (5) through a circuit (4) having a FET (field effect transistor) to obtain a value of 25 mV. This would indicate that the film functioned as a pressure sensitive element. The degree of dielectric polarization in the film varied depending on the stress imposed thereto, and, therefore, the film can be formed into a pressure sensitive to obtain a single which corresponds to the stress.

EXAMPLE 10

The copolymer as prepared in Example 1 was dissolved in acetone and the solution was cast on an aluminium plate to form a coating film a thickness of 10 microns. After drying of the cast film, gold was deposited thereover using a vacuum metallizing technique.

This film was polarized using the same conditions as in Example 9.

When the aluminum plate was touched by hand or bent, a generation of a noticeably high voltage by means of the same circuit as in Example 1) was observed.

EXAMPLE 11

Two pieces of heat-molted sheets (120μ) comprising a copolymer of VDF and ethylenetetrafluoride (85/15; by weight) were polarized by using electrodes of tin foil at a temperature of 90° C. in an electrostatic field of an electrpotential gradient of 300 KV/cm. One of them was used for the measurement of piezoelectric modulus, and the other was used for the measurement of the surface potential decay at room temperature.

The first piezoelectric modulus was measured so as to find its anisotropy by cutting off the film at the angle of 0°, 45° and 90° respectively to a certain direction decided on the surface thereof. Thus, it can be seen from the following Table that the speciments thus obtained by cutting off the film exhibited exremely small anisotropy.

| Angle (°C.) | d (cgsesu) |
|---|---|
| 0 | $1.1 \times 10^{-7}$ |
| 45 | $1.0 \times 10^{-7}$ |
| 90 | $1.0 \times 10^{-7}$ |

The variation of the surface potential of the other film is shown below.

| Time (minutes) | Surface Potential (anode side) (Volts) |
|---|---|
| 0 | +510 |
| 40 | + 72 |
| 120 | −10 |
| 1080 | −12 |

As is shown in the above Table, it can be seen that the small minus charge can be considered to be electrification, and the polarization as a surface potential on the film is rapidly lost.

This film showed a piezoelectric modulus of $1.0 \times 10^{-7}$ cgsesu.

What is claimed is:

1. A polymeric piezoelectric element comprising an unoriented shaped and polarized element of a copolymer of at least about 50% by weight of vinylidene fluoride and tetrafluoroethylene, said element having a piezoelectric modulus in excess of about $10^{-8}$ cgsesu.

2. The element of claim 1, including electrodes on two surfaces of said element.

3. The element of claim 2, wherein said electrodes are formed by a vacuum metallizing process.

4. A polymeric piezoelectric element comprising, an oriented shaped and polarized element of a copolymer of at least about 50% by weight of vinylidene fluoride and tetrafluoroethylene, said element having a piezoelectric modulus in excess of about $10^{-8}$ cgsesu.

5. The element of claim 4, including electrodes on two surfaces of said element.

6. The element of claim 5, wherein said electrodes are formed by a vacuum metallizing process.

7. The element of claim 1, wherein from 99 to 50 weight % of vinylidene fluoride is present with from 1 to 50% of said tetrafluoroethylene.

8. The element of claim 4, wherein from 99 to 50 weight % of vinylidene fluoride is present with from 1 to 50% of said tetrafluoroethylene.

9. The element of claim 1, wherein said element has a piezoelectric modulus of about $10^{-6}$ cgsesu or more.

10. The element of claim 1, wherein said element is in the shape of a film.

11. The element of claim 1, wherein said element has a piezoelectric modulus $d_{31}$ of about $1.0 \times 10^{-7}$ to $8.3 \times 10^{-7}$ cgsesu.

12. The element of claim 4, wherein said element has a piezoelectric modulus of about $10^{-6}$ cgsesu or more.

13. The element of claim 4, wherein said element is in the shape of a film.

14. The element of claim 4, wherein said element has a piezoelectric modulus $d_{31}$ of about $9.0 \times 10^{-8}$ to $8.5 \times 10^{-7}$ cgsesu.

15. A polymeric piezoelectric element comprising an unoriented and polarized element consisting of a copolymer of at least about 50% by weight of vinylidene fluoride and tetrafluoroethylene, said element having a piezoelectric modulus in excess of about $10^{-8}$ cgsesu.

* * * * *